(12) United States Patent
Sudou

(10) Patent No.: US 7,737,782 B1
(45) Date of Patent: Jun. 15, 2010

(54) OPERATIONAL AMPLIFIER CIRCUIT

(75) Inventor: Minoru Sudou, Austin, TX (US)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/355,264

(22) Filed: Jan. 16, 2009

(51) Int. Cl.
*H03F 3/45* (2006.01)
(52) U.S. Cl. .................................. 330/253; 330/261
(58) Field of Classification Search .............. 330/253, 330/257, 261
See application file for complete search history.

(56) References Cited

U.S. PATENT DOCUMENTS 6,614,302 B2 * 9/2003 Abe ........................ 330/253

2002/0125950 A1 9/2002 Abe

FOREIGN PATENT DOCUMENTS

JP 2002-344261 A 11/2002

* cited by examiner

*Primary Examiner*—Robert Pascal
*Assistant Examiner*—Khiem D Nguyen
(74) *Attorney, Agent, or Firm*—Brinks Hofer Gilson & Lione

(57) ABSTRACT

Provided is a CMOS operational amplifier circuit that can operate with low noise, with low current consumption, and with stability. A cascode bias voltage of a folded cascode circuit in the CMOS operational amplifier circuit is modulated by a current at an input differential stage, thereby enabling operation with low noise, with low current consumption, and with stability.

3 Claims, 5 Drawing Sheets

US 7,737,782 B1

OPERATIONAL AMPLIFIER CIRCUIT

BACKGROUND OF THE INVENTION

1. Field of the Invention

The present invention relates to an operational amplifier circuit for CMOS input having an input voltage ranging from a negative power supply voltage to a positive power supply voltage.

2. Description of the Related Art

As a conventional CMOS operational amplifier circuit, there has been known a circuit illustrated in FIG. 4 (for example, see JP 2002-344261 A).

The operational amplifier circuit is roughly divided into two blocks consisting of a differential input circuit part 100 and a folded cascode circuit part 200.

First, the operation of the differential input circuit part 100 is described. A power supply voltage is applied between a VDD terminal and a VSS terminal. A differential input signal is supplied to an INP terminal and an INM terminal. An input differential pair of the differential input circuit part 100 includes n-type MOS transistors MN1 and MN2, and p-type MOS transistors MP1 and MP2. The input differential pair is thus configured, thereby enabling the operation in a wide input voltage range so that the p-type MOS transistor differential pair operates when the input voltage is low, and the n-type MOS transistor differential pair operates when the input voltage is high. That is, a voltage range of the differential input signal can be ensured from a negative power supply voltage (VSS) to a positive power supply voltage (VDD).

A MOS transistor MS1 is a MOS transistor for a current changeover circuit.

When the input voltage of the differential transistor pair is high and close to VDD, the MOS transistor MS1 is turned on. A current of a constant current source Ib1 flows in the n-type MOS transistors MN1 and MN2 by means of a current mirror circuit including a MOS transistor MS2 and a MOS transistor MS3. Accordingly, the n-type MOS transistor differential pair operates.

When the input voltage of the differential transistor pair is low and close to VSS, the MOS transistor MS1 is turned off. The current of the constant current source Ib1 flows in the p-type MOS transistors MP1 and MP2. Accordingly, the p-type MOS transistor differential pair operates.

Subsequently, the operation of the folded cascode circuit part 200 is described. The folded cascode circuit part 200 adds current signals from the p-type and n-type MOS transistor differential pairs of the differential input circuit part 100 together to output the added current signals to an output terminal OUT.

A voltage source Vb2 applies a cascode bias voltage to MOS transistors MP5 and MP6. For example, as illustrated in FIG. 5, a current is allowed to flow in a MOS transistor MB1 which is saturation-connected by a constant current source Ib4 to develop a voltage.

In general, a voltage Vgs between the gate and the source of the saturation-connected MOS transistor is represented by Expression (1).

$$Vgs = \sqrt{\frac{2 \times Id}{\beta}} + Vt \qquad (1)$$

where Id is a drain current of the MOS transistor (=constant current value of the constant current source Ib4), β is a parameter determined according to the process and the size of the MOS transistor, and Vt is a threshold voltage of the MOS transistor.

When the input voltage of the differential transistor pair of the differential input circuit part 100 is low and close to VSS, the current changeover MOS transistor MS1 is off, and hence no current flows in the n-type MOS transistors MN1 and MN2. In that state, currents of MOS transistors MP3 and MP4 in the folded cascode circuit are values obtained by subtracting a half current of the constant current source Ib1 from the currents of a constant current source Ib2 and a constant current source Ib3. The constant current source Ib2 and the constant current source Ib3 are so configured as to allow a current of the same current value IB2 to flow. When the current value of the constant current source Ib1 is IB1, the current values of the MOS transistors MP3 and MP4 are IB2−IB1/2.

On the other hand, when the input voltage of the differential transistor pair is high and close to VDD, the current changeover MOS transistor MS1 is on, and hence a current flows in the n-type MOS transistors MN1 and MN2. If the same current as the current value of the constant current source Ib1 flows in the MOS transistor MS3, current values of the MOS transistors MP3 and MP4 in the folded cascode circuit become IB2+IB1/2.

That is, the current values of the MOS transistors MP3 and MP4 change according to an input voltage.

A saturated voltage Vdsat of the MOS transistor is represented by Expression (2).

$$Vdsat = \sqrt{\frac{2 \times Id}{\beta}} \qquad (2)$$

where Id is a drain current of the MOS transistor, and β is a parameter determined according to the process and the size of the MOS transistor. As is apparent from Expression (2), when the current Id that flows in the MOS transistor changes, the saturated voltage Vdsat of the MOS transistor changes.

A cascode bias voltage is required to be set so that the drain-source voltages of the MOS transistors MP3, MP4, and MP5 become equal to or higher than the saturated voltage so as to prevent the MOS transistors MP3, MP4, and MP5 from falling within a unsaturated region.

In order to reduce the noise and the current consumption, the conventional CMOS operational amplifier circuit is required to reduce the currents of the constant current source Ib2 and the constant current source Ib3. In that case, the currents that flow in the MOS transistors MP3, MP4, and MP5 greatly change, that is, the fluctuation of the drain voltage becomes large according to the current from the differential input circuit part 100. Hence, the fear that the MOS transistors MP3 and MP5 fall within the unsaturated region becomes large, and therefore the gain of the amplifier is deteriorated.

That is, in the conventional CMOS operational amplifier circuit, it is difficult to design a circuit that operates with low noise, with low current consumption, and with stability.

SUMMARY OF THE INVENTION

In view of the above-mentioned circumstances, the present invention has been made to solve the above-mentioned problem with the conventional art, and therefore it is an object of the present invention to provide a CMOS operational amplifier circuit that operates with low noise, with low current consumption, and with stability.

In the CMOS operational amplifier circuit according to the present invention, a cascade bias voltage of a folded cascade circuit is modulated by a current at an input differential stage so that the MOS transistors MP3 and MP5 operate in a saturated region, thereby solving the above-mentioned problem.

According to the above-mentioned CMOS operational amplifier circuit of the present invention, the cascade bias voltage of the folded cascade circuit is modulated by the current at the input differential stage, thereby enabling the stable operation to be conducted even with low noise and with low current consumption.

DETAILED DESCRIPTION OF THE PREFERRED EMBODIMENTS

Figure 1:
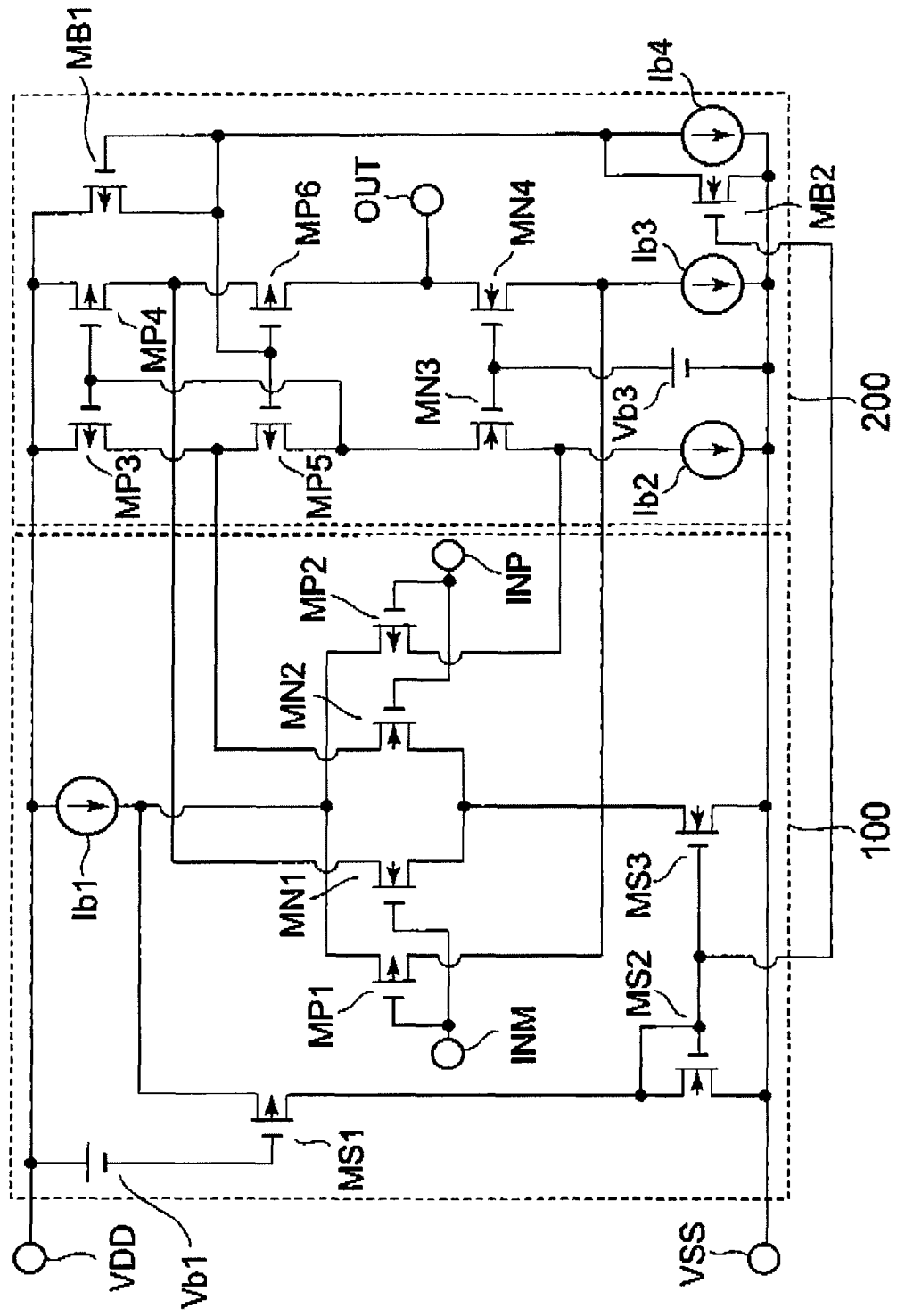
FIG. 1 is a circuit diagram illustrating a CMOS operational amplifier circuit according to an embodiment of the present invention.

FIG. 1 is a circuit diagram illustrating a CMOS operational amplifier circuit according to an embodiment of the present invention. The CMOS operational amplifier circuit illustrated in FIG. 1 includes a differential input circuit part 100, and a folded cascode circuit part 200.

The differential input circuit part 100 includes a p-type MOS transistor differential pair including p-type MOS transistors MP1 and MP2, and an n-type MOS transistor differential pair including n-type MOS transistors MN1 and MN2. The p-type MOS transistor differential pair has a constant current source Ib1 connected to a VDD terminal side. The n-type MOS transistor differential pair has a MOS transistor MS3 serving as a constant current source connected to a GND terminal side. Then, the differential input circuit part 100 also includes a MOS transistor MS1 of a current changeover circuit, and a MOS transistor MS2 that constitutes a current mirror circuit with the MOS transistor MS3.

The folded cascode circuit part 200 includes a vertically stacked current mirror circuit including MOS transistors MP3 and MP4 as well as MP5 and MP6, MOS transistors MN3 and MN4 and a voltage source Vb3 which constitute a current source, constant current sources Ib2 and Ib3, and a saturation-connected MOS transistor MB1 and a constant current source Ib4 constituting a bias voltage source Vb2 of the MOS transistors MP5 and MP6.

Further, the folded cascode circuit part 200 includes a MOS transistor MB2 connected in parallel to the constant current source Ib4. A gate of the MOS transistor MB2 is connected to a gate and a drain of the transistor MS2 that mirrors a current in the current changeover MOS transistor MS1.

First, the operation of the differential input circuit part 100 is described. A power supply voltage is applied between a VDD terminal and a VSS terminal. A differential input signal is supplied to an INP terminal and an INM terminal. An input differential pair of the differential input circuit part 100 includes the n-type MOS transistors MN1 and MN2, and the p-type MOS transistors MP1 and MP2. The input differential pair is thus configured, thereby enabling the operation in a wide input voltage range so that the p-type MOS transistor differential pair operates when the input voltage is low, and the n-type MOS transistor differential pair operates when the input voltage is high. That is, a voltage range of the differential input signal can be ensured from a negative power supply voltage (VSS) to a positive power supply voltage (VDD).

The MOS transistor MS1 is a MOS transistor for a current changeover circuit.

When the input voltage of the differential transistor pair is high and close to VDD, the MOS transistor MS1 is turned on. A current of the constant current source Ib1 flows in the n-type MOS transistors MN1 and MN2 by means of the current mirror circuit including the MOS transistor MS2 and the MOS transistor MS3. Accordingly, the n-type MOS transistor differential pair operates.

When the input voltage of the differential transistor pair is low and close to VSS, the MOS transistor MS1 is turned off. The current of the constant current source Ib1 flows in the p-type MOS transistors MP1 and MP2. Accordingly, the p-type MOS transistor differential pair operates.

Subsequently, the operation of the folded cascode circuit part 200 is described. The folded cascode circuit part 200 adds current signals from the p-type and n-type MOS transistor differential pairs of the differential input circuit part 100 together to output the added current signals to an output terminal OUT.

The saturation-connected MOS transistor MB1 develops a voltage due to a current flowing from the constant current source Ib4. The developed voltage is applied to the MOS transistors MP5 and MP6 as a cascode bias voltage. The MOS transistor MB2 connected in parallel to the constant current source Ib4 allows a current predetermined times as large as a current flowing in the n-type MOS transistors MN1 and MN2 to flow in the transistor MB1.

The cascode bias voltage, that is, a voltage Vgs between the gate and the source of the MOS transistor MB1 is represented by Expression (3).

$$Vgs = \sqrt{\frac{2 \times (IB\ 4 + Id\ 2)}{\beta}} + Vt \tag{3}$$

where IB4 is a constant current value of the constant current source Ib4, Id2 is a drain current of the MOS transistor MB2, β is a parameter determined according to the process and the size of the MOS transistor, and Vt is a threshold voltage of the MOS transistor. As is apparent from Expression (3), the cascade bias voltage is a value modulated by a current flowing in the n-type MOS transistor differential pair.

When a current flows in the n-type MOS transistor differential pair, the currents of the MOS transistors MP3 and MP4 become IB2+IB1/2, and a saturated voltage Vdsat of the MOS transistors MP3 and MP4 is represented by Expression (4).

$$Vdsat = \sqrt{\frac{2 \times (IB\ 2 + IB\ 1/2)}{\beta}} \tag{4}$$

When no current flows in the n-type MOS transistor differential pair, the current in the MOS transistors MP3 and MP4 is IB2−IB1/2, and the saturated voltage Vdsat of the MOS transistors MP3 and MP4 is represented by Expression (5).

$$Vdsat = \sqrt{\frac{2 \times (IB\,2 - IB\,1/2)}{\beta}} \quad (5)$$

When IB2>>IB1, the saturated voltage of the MOS transistors MP3 and MP4 does not largely change as a value regardless of whether or not a current flows in the n-type MOS transistor differential pair. However, in the case of taking lower current consumption into consideration, it is difficult to satisfy IB2>>IB1, and IB1 and IB2 are values in the equivalent range. Hence, the saturated voltage of the MOS transistors MP3 and MP4 changes according to a value of the current in the n-type MOS transistor differential pair.

From Expression (4), the saturated voltage Vdsat of the MOS transistors MP3 and MP4 when a current flows in the n-type MOS transistor differential pair is larger than a value (Expression (5)) when no current flows therein.

On the other hand, the MOS transistor MP5 has a drain connected to the gates of the MOS transistors MP3 and MP4, and hence the drain voltage of the MOS transistor MP5 changes according to the currents in the MOS transistors MP3 and MP4. That is, the drain voltage Vd5 of the MOS transistor MP5 when a current flows in the n-type MOS transistor differential pair is represented by Expression (6), and the drain voltage Vd5 of the MOS transistor MP5 when no current flows in the n-type MOS transistor differential pair is represented by Expression (7).

$$Vd\,5 = VDD - \sqrt{\frac{2 \times (IB\,2 + IB\,1/2)}{\beta}} - Vt \quad (6)$$

$$Vd\,5 = VDD - \sqrt{\frac{2 \times (IB\,2 - IB\,1/2)}{\beta}} - Vt \quad (7)$$

Figure 4:
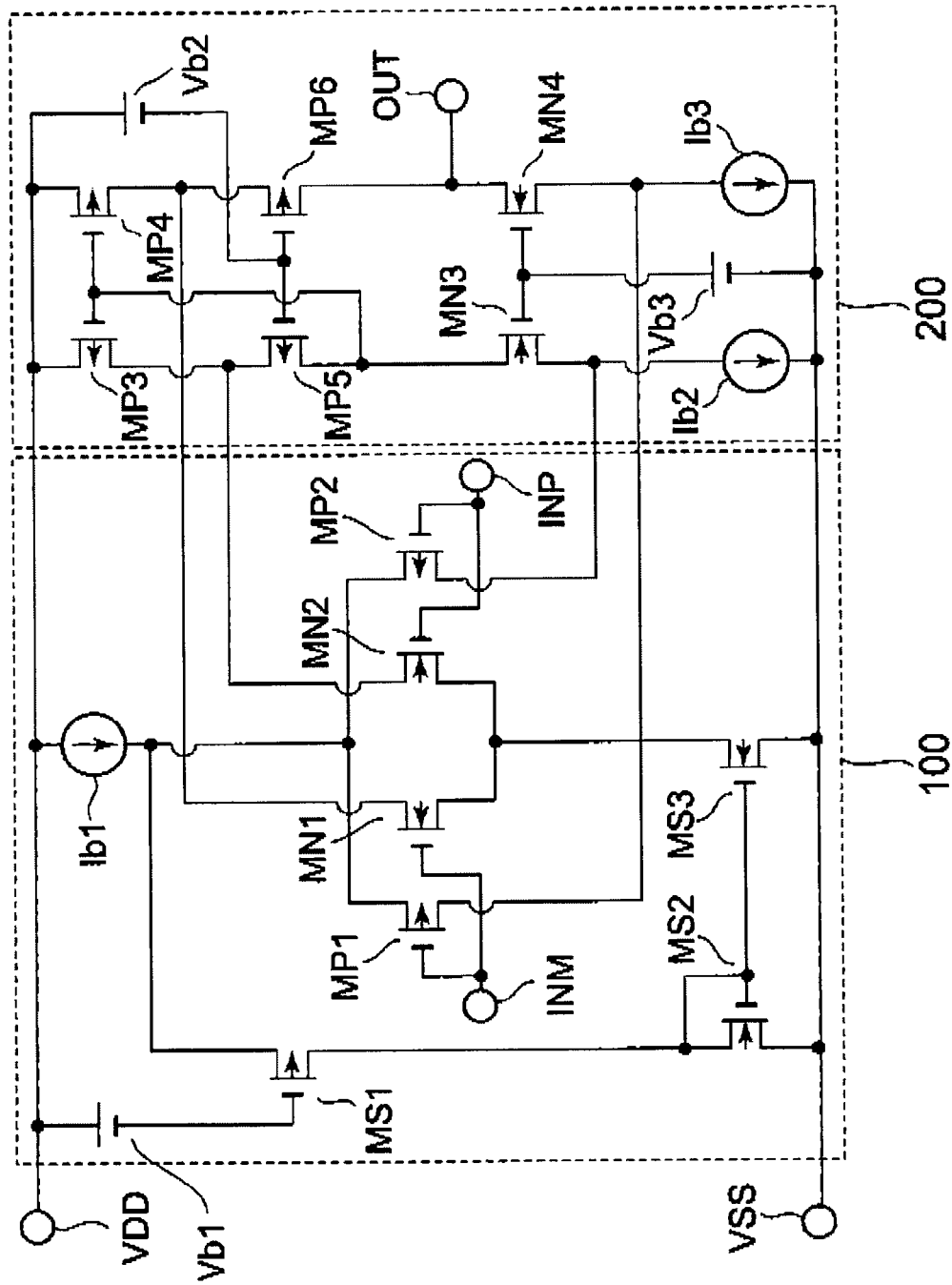
FIG. 4 is a circuit diagram illustrating a conventional CMOS operational amplifier circuit.

Accordingly, in the case where a cascode bias voltage Vb2 is set at the same time when a current flows in the n-type MOS transistor differential pair in the conventional circuit of FIG. 4, Expression (8) must be satisfied as a value of Vb2 in order to allow the MOS transistor MP3 to operate in the saturated region.

$$Vb2 > Vdsat + Vgs5 \quad (8)$$

where a value of Vdsat is the value of Expression (4), and Vgs5 is a voltage between the gate and source of the MOS transistor MP5. In the case of setting Vb2 so as to satisfy Expression (8), when no current flows in the n-type MOS transistor differential pair, the drain voltage Vd5 of the MOS transistor MP5 is represented by Expression (7), and there is the fear that the MOS transistor MP5 falls within the unsaturated region.

As described above, when IB2>>IB1 is set, the fear that the MOS transistor MP5 falls within the unsaturated region is lowered. However, in the case of considering the lower current consumption, IB2>>IB1 cannot be satisfied.

Also, a width of the fluctuation of the saturated voltage when the current changes is varied according to the parameter β determined by the process and the size of the MOS transistor through Expressions (4) and (5). That is, the width of the fluctuation of the saturated voltage with respect to a change in current becomes larger as β is smaller.

Figure 5:
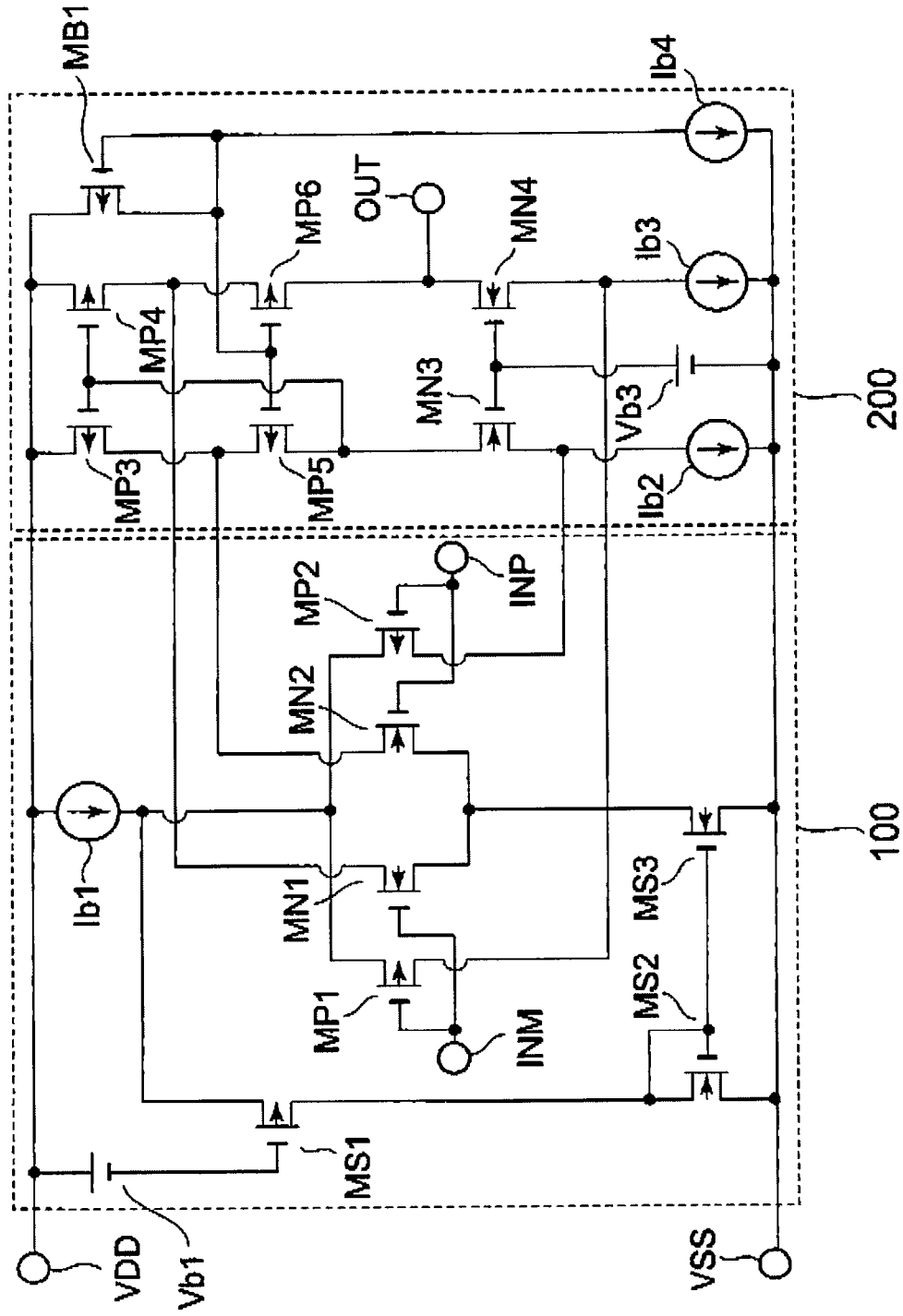
FIG. 5 is a circuit diagram illustrating another conventional CMOS operational amplifier circuit.

The parameter β has a relationship proportional to W/L with respect to a width W and a length L of the shape of the MOS transistor. However, in the conventional CMOS operational amplifier circuits illustrated in FIGS. 4 and 5, in order to reduce the noise voltage, it is necessary to reduce the transconductance gm of the MOS transistors MP3 and MP4. gm is proportional to √W/L, and hence β is required to be reduced in the low noise amplifier circuit. As a result, in a given cascode bias voltage Vb2, the fear that the MOS transistors MP3 and MP5 fall within the unsaturated region is high.

In the CMOS operational amplifier circuit according to the present invention, when a current flows in the n-type MOS transistor differential pair, a current is allowed to flow in the MOS transistor MB1, and hence the cascade bias voltage is large. As a result, the MOS transistor MP3 can surely operate in the saturated region. Also, when no current flows in the n-type MOS transistor differential pair, the cascode bias voltage is reduced. As a result, the MOS transistor MP5 can surely operate in the saturated region.

Figure 2:
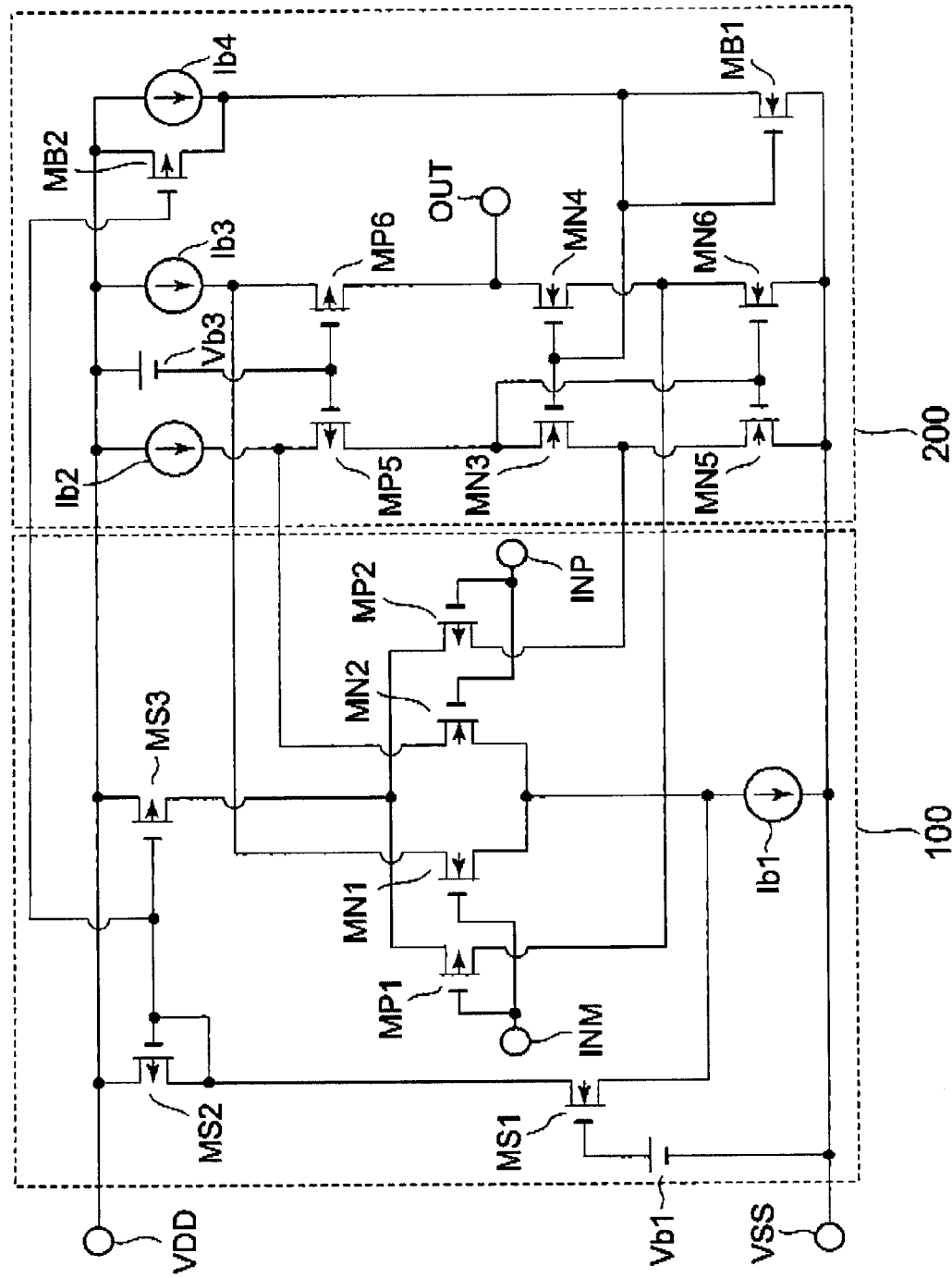
FIG. 2 is a circuit diagram illustrating a CMOS operational amplifier circuit according to another embodiment of the present invention.

In FIG. 1, a current of the constant current source Ib1 connected to the VDD terminal side is switched over by the MOS transistor MS1 serving as the current changeover circuit under the control. Alternatively, as illustrated in FIG. 2, the current of the constant current source Ib1 connected to the VSS terminal side can be controlled.

Figure 3:
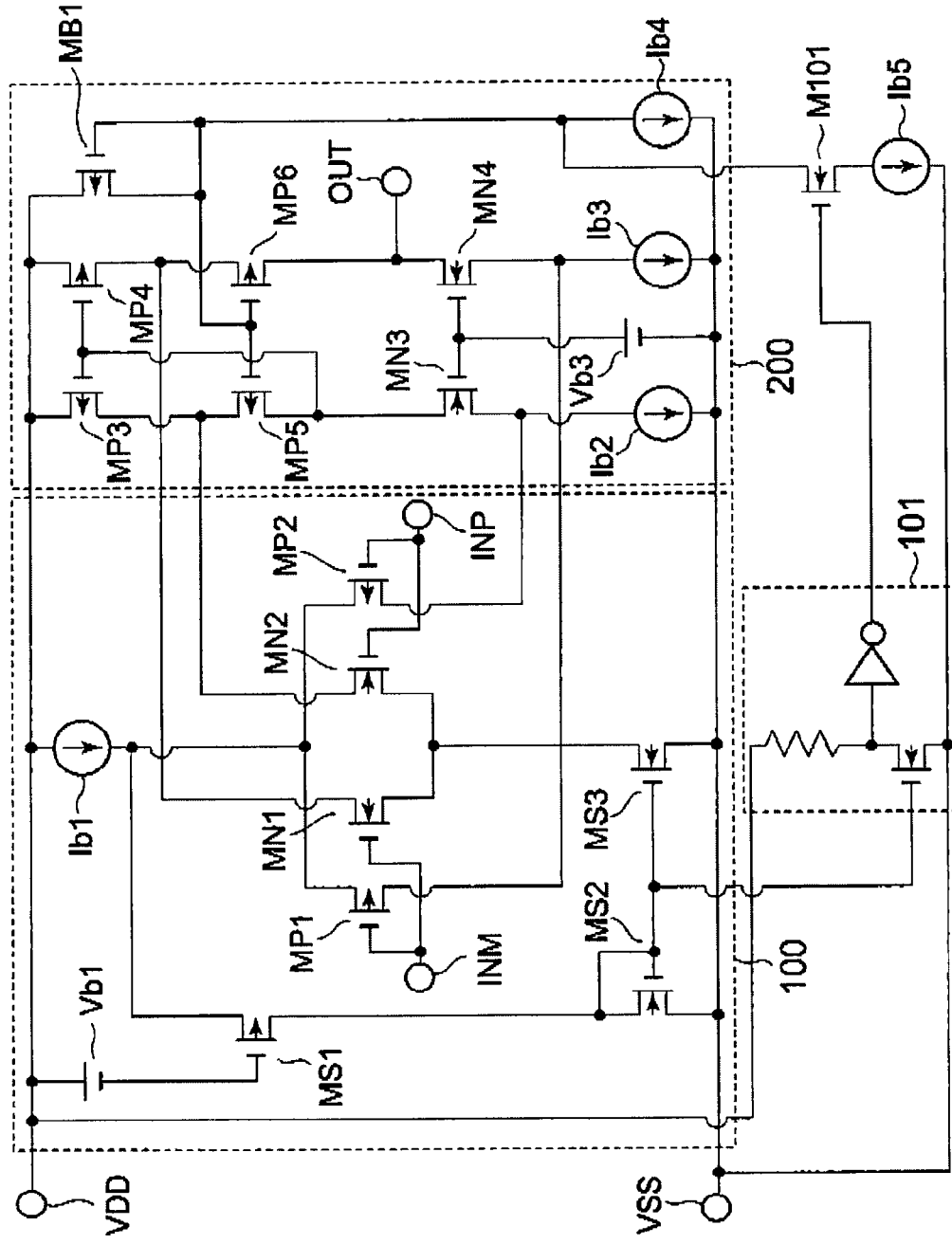
FIG. 3 is a circuit diagram illustrating a CMOS operational amplifier circuit according to still another embodiment of the present invention.

FIG. 3 illustrates a circuit diagram of a CMOS operational amplifier circuit according to another embodiment of the present invention.

The CMOS operational amplifier circuit illustrated in FIG. 3 includes a current changeover detector circuit 101, a MOS transistor M101, and a constant current source Ib5.

The current changeover detector circuit 101 detects that a current flows in the n-type MOS transistor differential pair with a change in input voltage. The MOS transistor M101 is turned on and off according to an output of the current changeover detector circuit 101. The constant current source Ib5 changes the cascode bias voltage of a succeeding folded cascode circuit according to the on/off operation of the MOS transistor M101.

As illustrated in FIG. 3, the current of the constant current source Ib5 which is allowed to flow in the MOS transistor MB1 is controlled in synchronism with the changeover of the input differential pair, thereby obtaining the same effect even if the cascode bias voltage is modulated.

What is claimed is:

1. A CMOS operational amplifier circuit, comprising:
   a differential input circuit part; and
   a folded cascode circuit part,
   wherein the differential input circuit part comprises:
      a p-type MOS transistor differential pair and an n-type MOS transistor differential pair, which have a positive input terminal and a negative input terminal in common;
      a first constant current circuit that supplies an operation current to the p-type MOS transistor differential pair and the n-type MOS transistor differential pair; and
      a current changeover circuit that supplies the operation current of the first constant current circuit to the p-type MOS transistor differential pair and the n-type MOS transistor differential pair in turn,
   wherein the folded cascode circuit part comprises:
      a cascode connection current mirror circuit;

a second constant current circuit and a third constant current circuit, which are connected in series with the cascade connection current mirror circuit; and a bias voltage source that applies a bias voltage to the cascode connection current mirror circuit, and wherein the bias voltage source increases the bias voltage when the operation current flows in the n-type MOS transistor differential pair.

2. A CMOS operational amplifier circuit according to claim 1, wherein the bias voltage source changes over the bias voltage according to where the operation current is made to flow by the current changeover circuit.

3. A CMOS operational amplifier circuit according to claim 1, further comprising a current changeover detector circuit that detects an operation of the current changeover circuit, wherein the bias voltage source changes over the bias voltage according to a signal output by the current changeover detector circuit.

* * * * *